(12) United States Patent
Varadarajan (10) Patent No.: US 7,380,184 B2
(45) Date of Patent: May 27, 2008

(54) SEQUENTIAL SCAN TECHNIQUE PROVIDING ENHANCED FAULT COVERAGE IN AN INTEGRATED CIRCUIT

(75) Inventor: Devanathan Varadarajan, Chennai (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/308,888

(22) Filed: May 23, 2006

(65) Prior Publication Data

US 2007/0168800 A1 Jul. 19, 2007

Related U.S. Application Data

(60) Provisional application No. 60/751,711, filed on Dec. 19, 2005.

(51) Int. Cl.
*G01R 31/28* (2006.01)

(52) U.S. Cl. .......................... 714/726; 714/729; 714/30; 714/724; 714/727; 324/73.1; 716/6; 716/7

(58) Field of Classification Search ...................... None
See application file for complete search history.

(56) References Cited

U.S. PATENT DOCUMENTS

| | | | | |
|---|---|---|---|---|
| 5,774,474 A | * | 6/1998 | Narayanan et al. | 714/726 |
| 5,949,692 A | * | 9/1999 | Beausang et al. | 716/18 |
| 6,023,778 A | * | 2/2000 | Li | 714/726 |
| 6,073,265 A | * | 6/2000 | Komoda | 714/738 |
| 6,106,568 A | * | 8/2000 | Beausang et al. | 716/18 |
| 6,496,966 B1 | * | 12/2002 | Barney et al. | 716/10 |
| 6,954,887 B2 | * | 10/2005 | Wang et al. | 714/729 |
| 7,134,061 B2 | * | 11/2006 | Agashe et al. | 714/726 |
| 2002/0184560 A1 | * | 12/2002 | Wang et al. | 714/25 |
| 2004/0268181 A1 | * | 12/2004 | Wang et al. | 714/30 |
| 2005/0235186 A1 | * | 10/2005 | Wang et al. | 714/728 |

OTHER PUBLICATIONS

Seongmoon Wang and Srimatt.Chakradhar, "A scalable Scan-Path Test Point Insertion Technique to Enhance Delay Fault Coverage for Standard ScanDesigns", ITC International Test Conference, from IEEE Journal, 2003, pp. 574-583, NECLabs. ,America,Princeton,NJ.

(Continued)

*Primary Examiner*—John P Trimmings
(74) *Attorney, Agent, or Firm*—Alan K. Stewart; W. James Brady; Frederick J. Telecky, Jr.

(57) ABSTRACT

According to an aspect of the present invention, multiple scan enable signals (controlling corresponding scan chains) are used in an integrated circuit, and the scan chains are placed in evaluation mode in non-overlapping durations between scan-in and scan-out operations. In an embodiment, a single clock signal drives the elements in both the scan chains, and the start and end of the non-overlapping durations are timed associated with the edges of the pulses of the clock signal. Multiple pulses of the clock signal may be used between the scan-in and scan-out. According to another aspect of the present invention, the scan elements are conveniently connected to different scan enable signals to take advantage of the non-overlapping durations.

4 Claims, 5 Drawing Sheets

OTHER PUBLICATIONS

Weiwei Mao and Micheal D. Ciletti, "Reducing correlation to improve coverage of delay faults inscan-path design", This paper appears in: Computer-Aided Design of Integrated Circuits and Systems, IEEE Transactions, vol. 13, Issue: 5, pp. 638-646, May 1994.

Jacob Savir and Srinivas Patil, "Scan-Based Transition Test", IEEE Transactions on Computer-aided Design of Integrated Circuits and Systems, pp. 1232-1241, vol. 12, No. 8, Aug. 1993.

Jayashree Saxena, Kenneth M. Butler, John Gatt, Raghuraman R, Sudheendra Phani Kumar, Supatra Basu, David J. Campbell and John Berech, "Scan-Based Transition Fault-Testing—Implementation and Low Cost Test Challenges" Pages.

R. Wilson, "Delay—fault testing mandatory, author claims", downloaded from the URL: http://www.eetimes.com/showArticle.jhtml?articleID=17408101, EE Design, pp. 1-2, Dec. 4, 2002.

Xijiang Lin, Ron Press, Janusz Rajski, Paul Reuter. Thomas Rinderknecht, Bruce Swanson, and Nageshi Tamarapalli, High-Frequency, At-Speed Scan Testing, IEEE Design and Test of Computers, pp. 17-25, Copublished by the IEEE CS and the IEEE CASS, Sep.-Oct. 2003.

Kee Sup Kim, Subhasish Mitra, and Paul G. Ryan, "Delay Defect Characteristics and Testing Strategies", IEEE Design & Test of Computers, pp. 8-16,Copublished by the IEEE CS and the IEEE CASS, Sep.-Oct. 2003.

K.M. Butler, "Estimating the economic benefits of DFT", IEEE Design & Test of Computers, pp. 102-104, Jan.-Mar. 1999 Annual Index, vol. 16.

Bulent I. Dervisoglu and Gayvin E. Strong, Design for Testability Using Scanpath Techniques for Pathdelay Test and Measurement from IEEE Journal, pp. 365-374, International Test Conference 1991.

Wei Li, Seongmoon Wang, Srimat T. Chakradhar and Sudhakar M.Reddy, "Distance Restricted Scan Chain Reordering to Enhance Delay Fault Coverage",Proceedings of the 18th International Conference on VLSI Design held jointly with 4th International Conference on Embedded Systems Design (VLSID'05), pp. 1-8, 2005.

Kwang-Ting Cheng, Sriinivas Devadas and Kurt Keutzer, "A Partial Enhanced-Scan Approach to Robust Delay-Fault Test Generation for Sequential Circuits in Proc", pp. 403-410, International Test Conference 1991.

Xiao Liu and Michael S. Hsiao, "Constrained ATPG for Broadside Transition Testing, in Proc",IEEE International Symposium on Defect and Fault Tolerance in VLSI systems, 2003.

Jacob Savir and Srinivas Patil, "On Board Side Delay Test", IBM Microelectronics Division, VLSI Test Symp., pp. 284-290, Sep. 1994.

John A. Waicukauski, Eric Lindbloom, Barry K. Rosen, and Vijay S. Iyengar, IBM"Transition Fault Simulation" IEEE Design & Test, pp. 32-38, Apr. 1987.

* cited by examiner

| SCAN ENABLE 1 | SCAN ENABLE 2 |
|---|---|
| HH | HH |
| HH | HL |
| HH | LH |
| HH | LL |
| HL | HH |
| HL | HL |
| HL | LH |
| HL | LL |
| LH | HH |
| LH | HL |
| LH | LH |
| LH | LL |
| LL | HH |
| LL | HL |
| LL | LH |
| LL | LL |

SEQUENTIAL SCAN TECHNIQUE PROVIDING ENHANCED FAULT COVERAGE IN AN INTEGRATED CIRCUIT

RELATED APPLICATION(S)

The present application is related to and claims priority from the co-pending U.S. provisional application Ser. No. 60/751,711, entitled, "Multiple Scan Enable Configuration for High Delay Fault Coverage and Compact Test Set", filed on: 12 Dec. 2005, naming the same inventor as in the present application as the inventor, and is incorporated in its entirety herewith.

BACKGROUND OF THE INVENTION

1. Field of the Invention

The present invention relates generally to the field of testing of integrated circuits, and more specifically to a sequential scan technique which leads to enhanced fault coverage in an integrated circuit

2. Related Art

Sequential scan techniques are often used to test integrated circuits. According to a typical sequential scan technique, integrated circuits are designed to operate in functional mode or test mode. In functional mode, elements in the integrated circuit are connected according to a desired design/topology and to provide a desired utility for which the integrated circuit is primarily designed.

In a test mode, the integrated circuit is designed to connect various memory elements (contained in the integrated circuit) such as flip-flops in a sequence referred to as a "scan chain" (i.e., the output of one elements is connected as an input to the next element). Integrated circuits are often provided with a scan enable signal/terminal to switch the connections of scan elements (flip-flops) from functional mode to test mode.

In an embodiment, a logic high on the scan enable signal may connect the scan elements in a scan chain for loading/unloading the scan chain. On the other hand, a logic low on scan enable signal may connect the scan elements in functional mode. The first element in the scan chain is generally designed to receive the input bits and the last element of the scan chain is designed to scan out the results of evaluation, as described below.

In a typical scan test scenario, the scan enable signal is first set to logic high and number of bits in a particular pattern of zeros and ones (scan vector) are sequentially (one bit at every clock cycle) loaded (scanned in) into scan chain through the first element. The number of bits contained in the scan vector generally equals the number of memory elements in a corresponding scan chain.

Once a scan chain is loaded with a scan vector, the scan enable signal is set to logic low. The integrated circuit is operated in functional mode for desired number of clock pulses. In the functional mode, the elements (generally the combinatorial logic) in the integrated circuit are evaluated based on the scanned in bits. The flip-flops are designed to latch the results of the evaluation.

The scan enable signal is once again set to logic high and the bits latched in the scan chain are sequentially unloaded (scanned out) one bit at every clock cycle through the last element in the scan chain. Often the loading of scan vector and unloading of results are performed in parallel. For example, while a new scan vector is loaded, the result from the previous evaluation is unloaded.

The received scan out is compared with an expected scan out corresponding to the scan vector to determine the various faults within the integrated circuit. Number of faults detected by a scan chain and corresponding set of scan vectors is referred to as fault coverage.

In a very large scale integrated circuit, multiple number of scan chains are used to obtain larger fault coverage in the integrated circuit. The scan chains may be operated in parallel to reduce (or avoid increase in) the test time.

However, increase in the number of scan chains or size of scan vector(s) results in the increase in cost and time for testing the integrated circuit. Accordingly what is needed is a sequential scan technique providing enhanced fault coverage in an integrated circuit.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, multiple scan enable signals (controlling corresponding scan chains) are used in an integrated circuit, and the scan chains are placed in evaluation mode in non-overlapping durations between scan-in and scan-out operations. Due to such a feature, an output of evaluation in one scan chain can conveniently be used to drive the input of an a scan element in another scan chain, thereby increasing the possibility of coverage of testing for the same scan-in vectors.

In an embodiment, a single clock signal drives the elements in both the scan chains, and the start and end of the non-overlapping durations are timed associated with the edges of the pulses of the clock signal. Multiple pulses of the clock signal may be used between the scan-in and scan-out operations.

According to another aspect of the present invention, the scan elements are conveniently connected to different scan enable signal to take advantage of the non-overlapping durations. In general, the controlling elements and controlled elements are sought to be placed in different scan chains to the extent possible.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
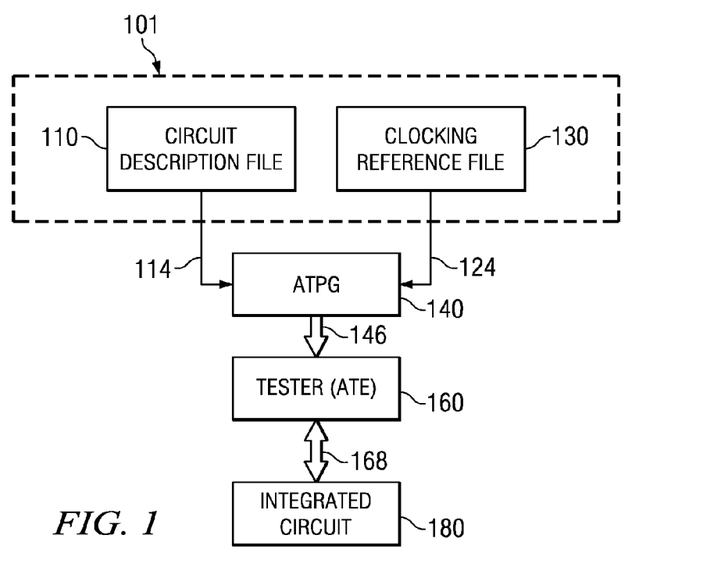
FIG. 1 is a block diagram illustrating the details of an example environment in which various aspects of the present invention can be implemented.

FIG. 1 is a block diagram illustrating the details of an example environment in which various aspects of the present invention can be implemented. The environment is shown containing circuit description file 110, clocking reference file 130, ATPG (Automatic test pattern generator) 140, tester (ATE) 160 and integrated circuit 180. Each block is described in further detail below.

Integrated circuit 180 is designed to operate in a functional mode and a test mode. Integrated circuit 180 provides interface 168 for enabling sequential scan test. Interface 168 often contains scan-in terminals, scan-out terminals, clock signal, scan enable terminals/signals and other data terminals.

Scan-in terminals provide interface for loading a scan chain and scan-out terminal provides interface for unloading the result of an evaluation. In general, the number of scan-in terminals and number of scan-out terminals equals the number of scan chains used for testing the integrated circuit 180.

Figure 2:
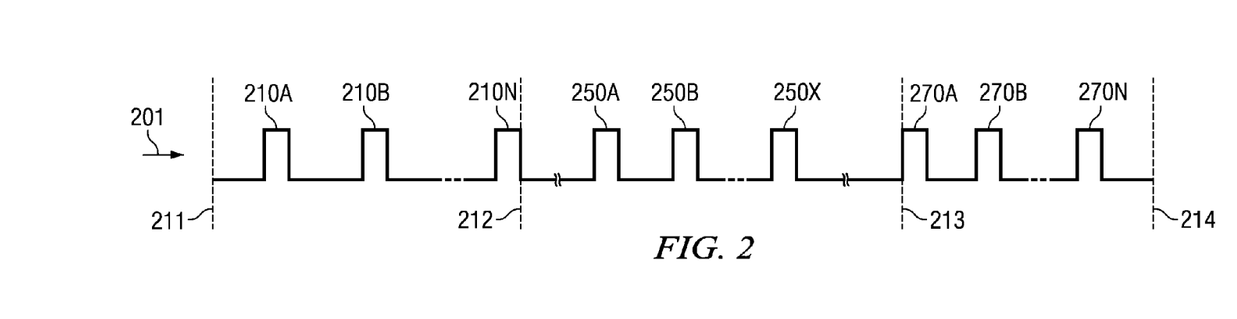
FIG. 2 is an example clock signal applied to integrated circuit for testing.

Clock signal terminal receives a reference clock pulses for loading a scan vector, operating in functional mode for evaluation and unloading the evaluation results. Sequential logic elements such as scan elements (flip-flops), memory elements etc, are operated at the received clock speed while performing the test. An example clock signal is illustrated in FIG. 2. Shown there is clock signal 201 containing scan-in pulses 210A-210N, evaluation pulses 250A-250X and scan-out pulses 270A-270N.

Scan-in pulses 210A-210N serially loads N bits of a scan vector into corresponding scan chain. At time point 212 (fall edge of 210N pulse) all the scan elements in the scan chains are loaded with the corresponding scan vector (V1). Similarly, scan-out pulses 270A-270N serially unload/shift out N bits representing result of an evaluation.

Scan-in pulses 210A-210N and scan-out pulses 270A-270N are shown as separate sequence of pulses for illustration, however scan-in pulses alone may be used to load a new scan vector and at the same time unload previous evaluation result.

The evaluation is performed using evaluation pulses 250A-250X between time point 212 (end of loading) and 213 (beginning of unloading of result). Evaluation pulses 250A-250X may be operated with different time period/frequency when compared to time period of scan-in pulses 210A-210N.

The scan enable terminals provide interface for controlling the connections of the scan elements. Generally, scan enable signal is held at logic high during loading of scan vectors (between time point 211 and 212) and while unloading of results (between time point 213 and 214). The scan enable signals are switched to logic low (as described in below sections) for determining various faults within (evaluation) integrated circuit 180.

Continuing with reference to FIG. 1, ATPG 140 generates test patterns to detect desired faults within integrated circuit 180. The test patterns define values for scan vectors, timing of clock pulses, reference time for switching scan enable signal from one logic level to other, logical levels on other data terminals and expected result for each scan vector loaded. ATPG 140 generates test patterns based on the description data 101 received on path 114 and path 124.

In general, description data 101 represents set of files such as circuit description file 110, clocking reference file 130 and other fault specifications (not shown). Circuit description file 110 provides the details of elements/component and connectivity within integrated circuit 180. Clocking reference file 130 provides details of operational frequency of each components, timing for clock signal for performing the test, time reference for switching scan enable signal etc. The other specification may represent power constraints, fault models for detecting the desired faults, etc.

Tester (Automatic test equipment) 160 generates test signals according to test pattern received from ATPG 140 through interface 146. The test signal containing the clock signal, scan enable signal and pulses representing scan vectors are provided to integrated circuit 180 on corresponding terminals of the interface 168. Tester 160 receives the result of the evaluation on scan-out terminal and compares the received result with the expected result received from ATPG 140. Tester 160 may also hold other data terminals at a desired logic levels as specified in the test pattern.

Tester 160 generates the test signals to provide enhanced coverage in testing of integrated circuits according to various aspects of the present invention. The features will be clearer in comparison to a prior approach in which at least some features of the present invention are not implemented. Accordingly, the details of such a prior system for detecting transition fault are described below first.

3. Prior Transition Fault Detection Techniques

Transition faults are generally detected using a pair of vectors (V1, V2), with V1 being termed as a initial vector which sets a target node to the initial value, and V2 is termed as a launch vector which launches (causes) a transition (a logic zero to logic high or vice versa) at the target node. The response of the integrated circuit to the launch vector V2 may be captured at functional speed.

Thus, transition fault detection may be viewed as containing 3 stages. 1) Initialization stage(IS), where the IC is initialized to a particular state (V1 is applied), 2) Launch stage (LS), where a transition is launched at the target node (V2 is applied), and 3) Capture state (CS), where the transition is propagated and captured at an observable point. The manner in which launch/transition stage is performed in one prior transition fault model (launch on shift) is described below in further detail.

Figure 3A:
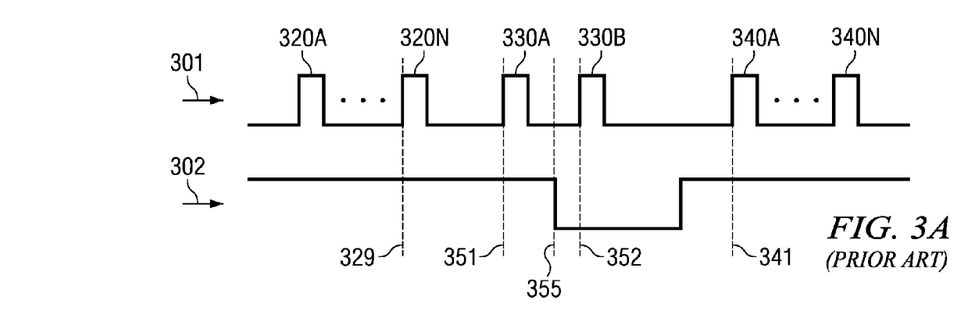
FIG. 3A is a timing diagram illustrating manner in which transition fault is detected in LOS (launch on shift) technique in one prior approach.

FIG. 3A is a timing diagram illustrating manner in which a transition fault is detected in a LOS (launch on shift)

technique. Timing diagram is shown containing clock signal 301 and scan enable signal 302. Each signal is described below in further detail.

Clock signal 301 is shown containing scan-in pulses 320A-320N, evaluation pulses 330-330B, and scan-out pulses 340A-340N. Evaluation pulses 330A and 330B are applied at the desired highest frequency (at speed) of operation. In this case, assuming scan elements in integrated circuit 180 are designed to operate on the rising edge of the pulses, the duration between rising edges 351 and 352 is controlled to achieve at speed operation.

The scan enable signal 302 is shown at logic high during scan-in pulses 320A-320N and scan-out pulses 340A-340N. Accordingly a scan vector with N bits is scanned in (loaded) to N element scan chain by the scan in pulse 320N. The loaded scan vector represents the initial vector (V1) described above.

Scan enable signal is maintained at logic high and evaluation pulse 330A is applied to launch a transition. Since scan enable signal is maintained at logic high, evaluation pulse 330A shifts the vector V1, thereby launching a transition at rising edge 351. The shifted vector V1 represents a launch vector V2 described above. The launch vector V2 is derived by shifting initial vector V1 and may be represented as:

$$V2=SH(V1) \qquad \text{Equation 1}$$

The scan enable signal is switched from logic high to logic low between time points 351 and 352 (at time point 355). As a result, the scan elements are connected in the functional mode. The functional response to the launched transition at rising edge 351 is captured by the raising edge 352. Since the time duration between 351 and 352 is set for at speed testing (as noted above), the integrated circuit is tested for at speed transition faults.

One known disadvantage with LOS technique is that it requires scan enable signal to be time critical. The scan enable signal is required to transition from logic high to logic low at functional speed (between at speed clock pulses 330A and 330B). Such a requirement increases the cost and complexity of the testing the integrated circuit.

Another prior transition fault testing model which overcomes at least some of the limitations noted above is described with reference to FIG. 3B.

Figure 3B:
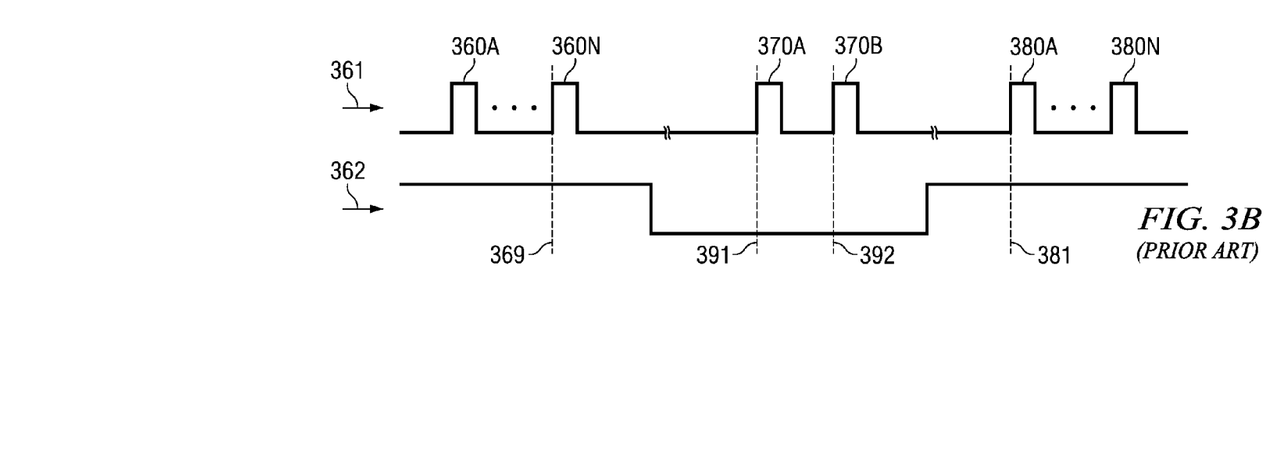
FIG. 3B is a timing diagram illustrating manner in which transition fault is detected in LOC (launch on capture) technique in another prior approach.

FIG. 3B is a timing diagram illustrating manner in which transition fault is detected in LOC (launch on capture) technique. The timing diagram is shown containing clock signal 361 and scan enable signal 362. Each signal is described below in further detail.

Clock signal 361 is shown containing scan-in pulses 360A-360N, evaluation pulses 370A-370B, and scan-out pulses 380A-380N. Evaluation pulses 370A and 370B are applied at operational frequency (at speed, i.e., the duration between edges 391 and 392 corresponds to at-speed operation). In this case, assuming scan elements in integrated circuit 180 are designed to operate on the rising edge of the pulses, rising edges 391 and 392 are applied at speed.

The scan enable signal 362 is shown at logic high during scan-in pulses 360A-360N and scan-out pulses 380A-380N. Accordingly a scan vector with N bits is scanned in (loaded) to N element scan chain by the scan in pulse 360N. The loaded scan vector represents the initial vector (V1) described above.

Scan enable signal 362 is shown transitioning from logic high to logic low after time point (after loading) 369. As a result the scan elements in the integrated circuit are connected in the functional mode. Two consecutive at speed pulses 370A and 370B are applied to integrated circuit 180. As a result, pulse 370A launches a transition at a desired node through functional path.

Hence, launch vector V2 represents the function of the V1 and may be represented as:

$$V2=f\{V1\} \qquad \text{Equation (2)}$$

wherein, $f\{\ \}$ represents functional relation between a first node on which the V1 vector is loaded (out put terminals of the scan elements) and second (observed) nodes (inputs of scan elements designed to capture the result). In general, the functional relation is determined by the combinational logic between the first node and a second node. Transition launched at time 391 is captured by evaluation pulse 370B at time point 392.

Scan enable signal is shown transitioning from logic low to logic high before time point 381. As a result the scan elements are connected to scan chain again. The results latched at time point 392 are scanned out by scan-out pulses 380A-380N for comparison. Since transition and capture are performed using pulses 370A and 370B timed for at speed operation, the transition faults are detected.

It may be appreciated that the scan enable 362 transition time (after time points 369 and before 381) may be selected independent of the at speed pulses 370A and 370B thereby relaxing the time critical requirements noted above. However, due to function relation between launch vector V2 and initial vector V1 (scan vector), pattern count (number of scan vectors) may increase to detect desired number faults with in integrated circuit. Further, complexity of pattern generation in ATPG 140 may increase due to functional relation between V1 and V2.

In order to increase the fault coverage, in one prior embodiment, dummy scan elements are added into the integrated circuit. A separate scan enable signal is provided to control the dummy scan elements. The transition test model operated some of scan enable signals according to LOS technique and other scan enable signals according to LOC technique (FIG. 3B) for increase in the fault coverage.

Addition of dummy scan elements results in increase in cost, size and power consumption of the integrated circuit and hence may be undesirable at least in some environments. Further, number of undetected faults may not be reduced in proportion to the complexity. Various aspects of present invention described below overcome at least some of the disadvantages described above.

4. Novel Fault Detection Technique.

Figure 4:
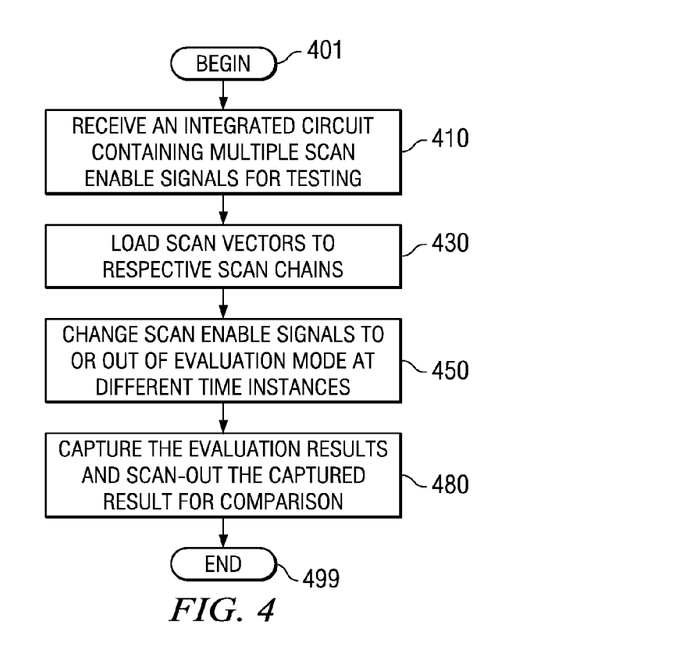
FIG. 4 is a flowchart illustrating a testing technique provided for enhanced fault coverage in an integrated circuit according to an aspect of present invention.

FIG. 4 is a flowchart illustrating a testing technique provided according to an aspect of present invention for enhanced fault coverage in an integrated circuit. The flowchart is illustrated with reference to FIG. 1 merely for illustration. The flowchart begins in step 401 and control passes to step 410.

In step 410 ATE 160 receives an integrated circuit containing multiple scan enable signals for testing. The integrated circuit may be connected to ATE 160 on interface 168 with multiple scan enable signals. Each scan enable signal may control a desired subset of scan elements connected in scan chain. In one embodiment of present invention 32 scan chains and two scan enable signals are used, with both the scan enable signals being used in at least some of the 32 scan chains.

In step 430, ATE 160 loads scan vectors to respective scan chains. ATE 160 loads the scan chain through scan-in terminal provided for the corresponding scan chain. The scan vectors, clock signal timing reference and other details may be generated based on the data received from ATPG 140. Loading of multiple/all the scan chains may be performed simultaneously (in parallel).

In step 450, ATE 160 changes scan enable signals to or out of evaluation mode at different time instances. In an embodiment, the time instances of the post-change status would thus coincide with corresponding edges of the clock signals, as described in sections below.

In step 480, ATE 160 captures the evaluation results and scans-out the captured results for comparison. All the scan enable signals are set to logic high (test mode) and the results may be scanned out sequentially. The flowchart ends in step 499.

From the above it may be readily observed that, by changing the state of scan enable signals at different time instances, multiple functional relation (shift of a functional response or functional response to a shifted scan vector, etc.) may be achieved between a first node and a second node. Various combinations of scan enable signal may enable generation of launch vector (V2) of different/desired values from a initial vector V1.

As a result the technique provided according to an aspect of present invention provide enhanced fault coverage for a given set of scan chain and scan vector. Example combination of transitions of scan enable signals providing enhanced fault detections are described below in further detail.

5. Example Transitions of Scan Enable Signals

Figure 5A:
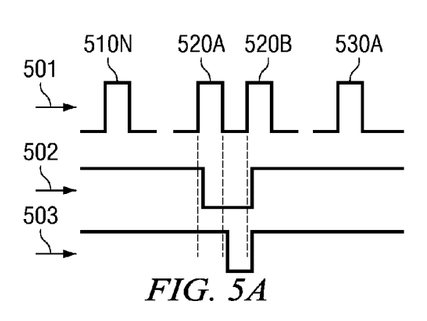
FIGS. 5A through 5C are timing diagram illustrating (some of) different transition combinations of scan enable signals according to various aspect of present invention.
Figure 5B:
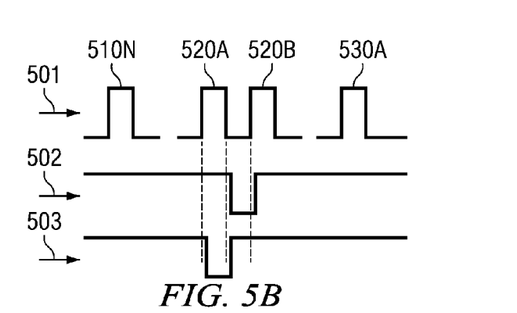
Figure 5C:
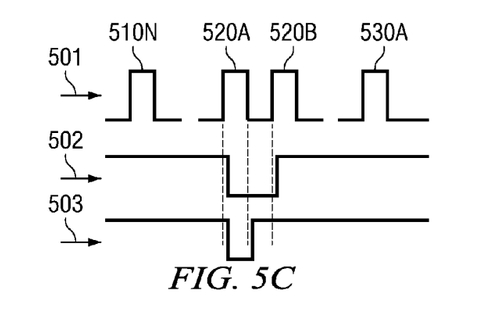

FIG. 5A through 5C are timing diagram illustrating different transition combinations of scan enable signal according to various aspect of present invention. The timing diagrams in FIG. 5A-5C is shown containing clock signal 501, first scan enable signal (SE1) 502 and second scan enable signal (SE2) 503. Clock signal 501 is shown with last scan-in pulse 51 ON, evaluation pulses 520A (launch) and 520B (capture), and first scan-out pulse 530A. Other scan in pulses and scan-out pulses are not shown for conciseness.

For ease of understanding, only two evaluation pulses are included between scan-in and scan out operations. However, many more evaluation pulses can be present between the scan-in and scan-out, without departing from the scope and spirit of various aspects of the present invention. In addition, the logic state of each scan enable signals during first evaluation pulse and second evaluation pulse (example of first duration and second duration) is represented by a corresponding character taking on a value of L if in the logic low state and H if in the logic high state. For example, HL represents a logic high during first evaluation pulse and logic low during second evaluation pulse.

Continuing with reference to FIGS. 5A-5C, first scan enable signal SE1 502 is respectively shown with logic state HL, HL, and HL in FIGS. 5A, 5B and 5C. Similarly second scan enable signal is shown maintaining logic states HL, HH and HH respectively in FIGS. 5A-5C.

Figure 5D:
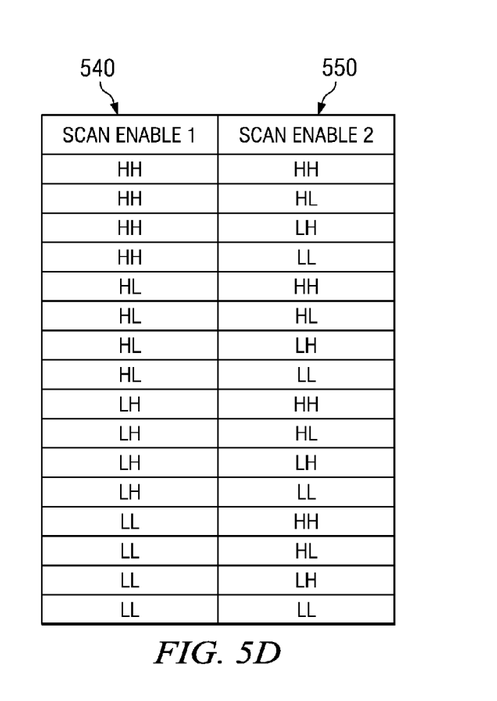
FIG. 5D is a table listing set of combinations of logic states for two valuation pulses and two scan enable signals.

It may be appreciated that in addition to the three combinations illustrated in FIGS. 5A-5C, other combinations of logic states may be used to derive desired launch vector V2. Example set of combinations of logic states are depicted in FIG. 5D. Shown there is a table listing 16 possible combinations of logic states for two scan enable signals during two evaluation pulses.

Column 540 contains entries representing the logic states of first scan enable signal during launch and capture pulses. Column 550 contains corresponding entries for second scan enable signal. Each row represents a possible combination of logic states of the first and second scan enable signals.

In general, the number of possible combinations may be represented as $4^n$ for two evaluation pulses. Wherein n represents number of scan enable signal. However, considering the logics wherein at least one scan enable is logic low during at least one of evaluation pulse (for capturing (some) the result) and excluding the repetition such as HL and LH, the number of useful states may be obtained as $4^n - 2^n$.

Accordingly, with reference FIG. 5D, from the 16 ($4^2$=16) possible combinations listed, 12 ($4^2 - 2^2$=12) valid combinations may be obtained with two scan enable signal and two evaluation pulses. Due to the availability of such a large choice, the test coverage is enhanced. By further increasing the number of evaluation pulses (between scan in and scan out), the choices and thus the coverage, can be further enhanced.

The manner in which a new combination obtained according to an aspect of present invention detects a fault is illustrated below with reference to FIG. 6.

6. Detection of Fault According to Present Invention

Figure 6:
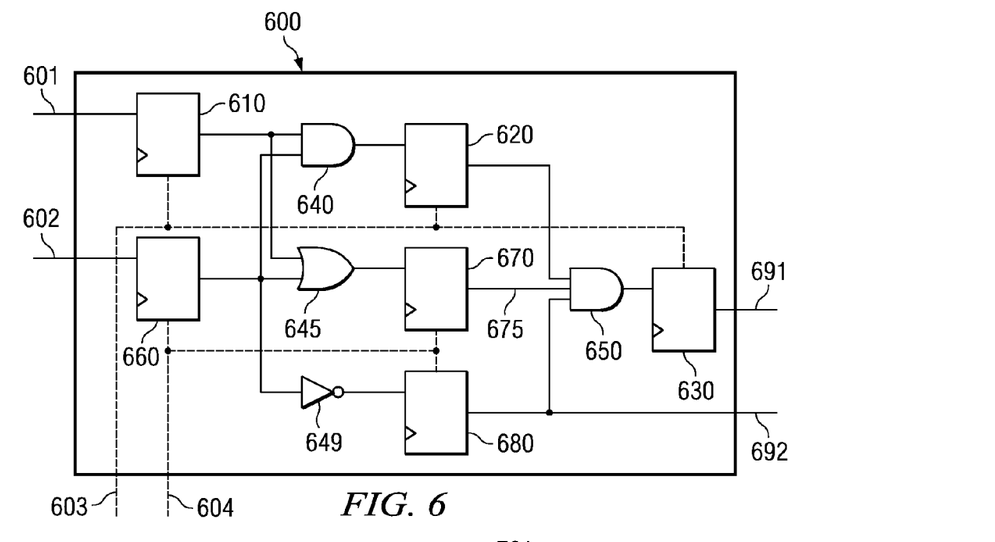
FIG. 6 is a circuit diagram of an example integrated circuit in which a transition fault is detected according to an aspect of present invention.

FIG. 6 is a circuit diagram of an example integrated circuit 600 in which fault is detected according to an aspect of present invention. Integrated circuit 600 is shown containing scan elements 610, 620, 630, 660, 670 and 680, AND gate 640 and 650, OR gate 645, and NOT gate 649. Each component is described below in further detail.

Scan elements 610, 620 and 630 are assumed be connected in a first scan chain and scan elements 660, 670 and 680 are connected in a second scan chain during testing. Scan elements 610 and 630 respectively represent first scan and last scan elements of the first scan chain. Scan elements 660 and 680 respectively represent first and last scan elements of the second scan chain.

Terminals 603 and 691 respectively represent the scan-in terminals and scan-out terminal of first scan chain. Similarly, terminal 604 and 692 respectively represent scan-in and scan-out terminals of second scan chain. Terminal 601 and 602 represents data terminal (other terminals referred with interface 168) and are shown respectively connected to functional inputs of scan elements 610 and 660.

The manner in which an example transition combination provided in FIG. 5B according to present invention may be used to detect a slow to rise fault (delay in transition from logic zero to logic one) on node (path) 675, described below. It should be appreciated that the approaches of FIGS. 3A and 3B may not detect such a fault.

Continuing with respect to FIG. 6, connectivity of scan elements 610, 620 and 630 is controlled using first scan enable signal (SE1) 502 (having HL characteristic in FIG. 5B). The connectivity of scan elements 660, 670 and 680 is controlled using a second scan enable signal (SE2) 503 (having HL characteristic in FIG. 5B).

A initial vector (V1) having logic values 1,1,1,0,0 and 1 are respectively loaded to scan elements 610, 620, 630, 660, 670 and 680. The initial values on the scan element may be represented as:

$$V1=\{610, 620, 630, 660, 670, 680\}=\{1,1,1,0,0,1\} \quad \text{Equation 3}$$

The loading of initial vector may be performed using known techniques. For example, a first scan vector {1, 1, 1} and a second scan vector {0, 0, 1} may be scanned in respectively into the first scan chain and second scan chain using three scan-in pulses. As a result, the output of the scan elements stores the corresponding digital values indicated in equation 3.

After loading the initial vector V1, signals/terminals 601-604 and scan enable signals 602 and 603 are set to values as:

$$S1=\{601, 602, 603, 603, 602, 603\}=\{1,1,0,1,1,0\} \quad \text{Equation 4}$$

The first scan enable signal is maintained at logic high and second scan enable signal is switched from logic high to logic low (at pulse 520B). As a result, scan elements 610, 620, and 630 remain connected in the scan chain and scan elements 660, 670 and 680 are connected in functional mode.

A first evaluation pulse 520A (launch pulse) is applied to the integrated circuit (scan elements). As a result scan elements 610, 620, and 630 shifts the values in the first scan chain (since corresponding scan enable signal (SE1) is at logic high). Scan elements 660, 670 and 680 respectively latches the logic values on terminal 602, output of OR gate 645 and output of NOT gate 649.

After launch pulse 520A, the logic values on the outputs of the scan elements may be represented as:

V2 (launch vector)={610, 620, 630, 660, 670, 680}={0,1,1,1,0,1}   Equation 5

The launch vector V2 launches transitions at (nodes) output of scan elements 610, 620, 630, and at node 675. A logic low to logic high transition is generated at node 675 to test slow to rise transition fault.

After launching the vector V2 by launch pulse 520A, signals/terminals 601-604 and scan enable signals 602 and 603 are set to values as:

S2={601, 602, 603, 603, 602, 603}={0,0,1,0,0,1}   Equation 4

The first scan enable signal is switched from logic high to logic low and second scan enable signal is switched from logic low to logic high. As a result, scan elements 610, 620, and 630 are connected in functional mode and scan elements 660, 670 and 680 are connected in shift mode.

The response to the launch vector is captured by applying the capture pulse (second evaluation pulse) 520B. The pulse 520B is applied at speed from the corresponding edge (rising edge in this case) of the launch pulse 520A. Scan element 630 captures the output of AND Gate 650 at the rising edge of the capture pulse. The captured value is scanned out to detect the fault. A value of logic 0 on the captured output of scan element 630 represents occurrence of slow to rise fault.

From the above description it may be appreciated that, by using the techniques described according to present invention for testing an integrated circuit with multiple scan enable terminal, a high fault coverage may be achieved by appropriately selecting the scan enable signals during the evaluation pulses.

The fault coverage may be further enhanced by suitably assigning each scan element to one of N scan enable signals during the design phase of an integrated circuit. Accordingly, manner in which a designer/design tool may assign N scan enable signal among the scan elements according to an aspect of present invention is described below in further detail.

7. Scan Enable Signal Assignment

Figure 7:
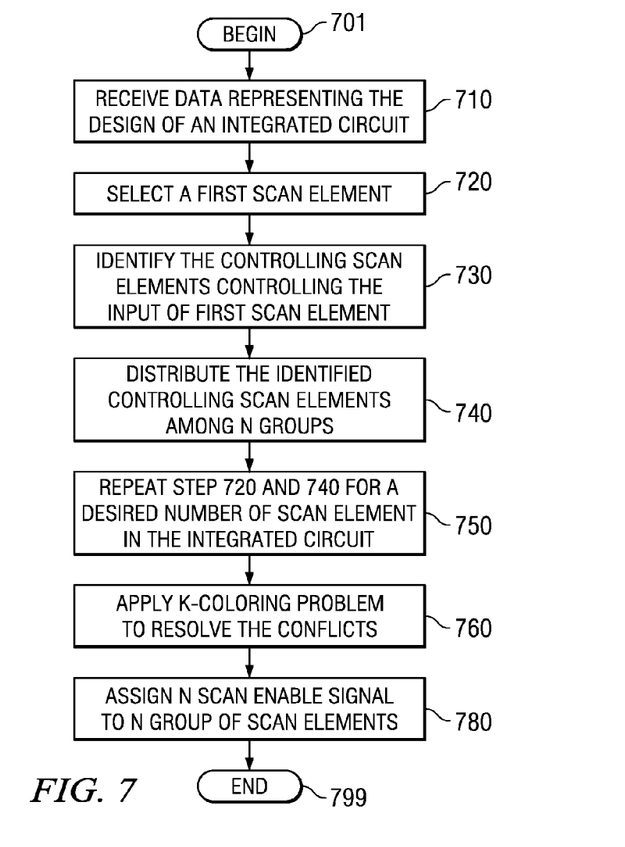
FIG. 7 is a flowchart illustrating the manner in which the scan elements are selected and assigned to N scan enable signals according to an aspect of present invention.

FIG. 7 is a flowchart illustrating the manner in which the scan elements are selected and assigned to N scan enable signals according to an aspect of present invention. The flowchart begins in step 701 and control immediately transfers to step 710.

In step 710, a designer/tool receives data representing the design of an integrated circuit. Details may be received in standard format such as netlist, etc., suitable for the corresponding tool. The netlist/details may indicate various memory elements designed/configured as scan elements (which need to be assigned to N scan enable signals) for the purpose of testing the integrated circuit.

In step 720, the designer/tool selects a first scan element. The first scan element may be selected suitably to perform actions/analysis described in the following steps. For example, if each scan element is assigned with an ID in an order, the first scan element in the order may be selected.

In step 730, the designer/tool identifies the controlling scan elements controlling the input of the first scan element. The controlling scan elements represents the set of scan elements whose output determines input of selected first scan element. The manner in which controlling scan elements may be identified is described below with reference to FIG. 8.

In step 740, the designer/tool distributes the identified controlling scan elements among N groups, preferably equally. The assignment to N group may be performed attaching a corresponding group tag to each scan element. The assignment is illustrated further with an example.

In step 750, the designer/tool repeats step 720 and 740 for all the scan elements in the integrated circuit. However, iterations may be truncated to desired number of scan elements for reducing the processor time and power. It should be appreciated that some of the scan elements (determined as controlling elements) may be assigned to multiple groups.

In step 760, the designer/tool applies K-coloring problem (well known in the relevant arts and described in a text book entitled, "Introduction to Algorithms", Second Edition, authored by T. H. Cormen, C. E. Leiserson, R. L. Rivest, C. Stein, and published by MIT Press, Cambridge, Ma., USA.) to resolve the conflicts to assign each scan element to one group. Alternative approaches can also be employed to resolve the conflict. For example, a scan element can be randomly assigned to one of the assigned groups.

In step 780, the designer/tool assigns each of N scan enable signal to corresponding one of N-groups (of scan elements). The flow chart ends in step 799.

Since the controlling and controlled elements are in different scan chains, the transitions on the scan enable signals can be conveniently timed to use the output of the controlling element as an input to the controlled element, thereby enhancing the coverage. The flowchart of FIG. 7 is further illustrated with a example with reference to FIG. 8.

8. EXAMPLE

Figure 8:
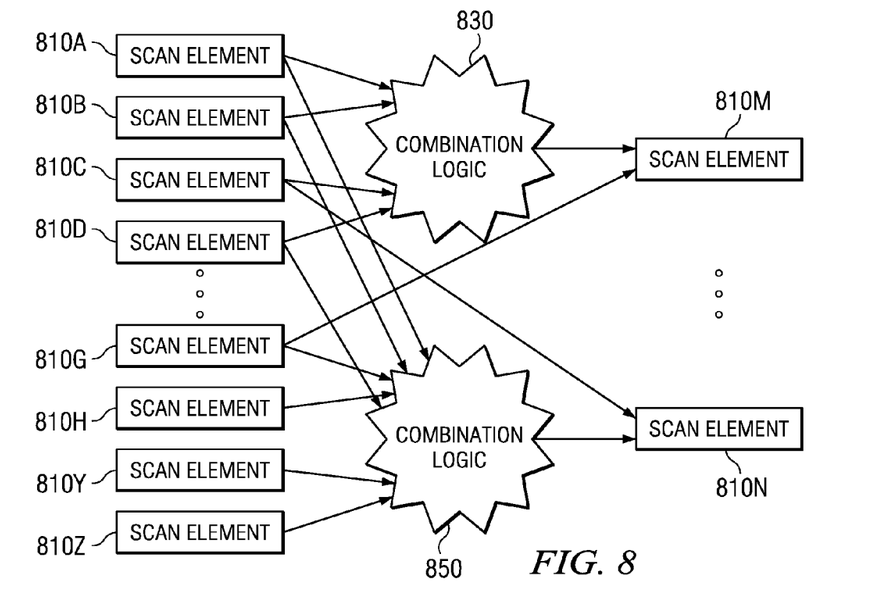
FIG. 8 is a block diagram representing an integrated circuit for illustrating various features described with respect to FIG. 7.

FIG. 8 is a block diagram representing an integrated circuit and is used for illustrating various features described in FIG. 7. The block diagram is shown containing scan elements 810A-810H, 810M-810N, 810Y and 810Z, and combinational logic 830 and 850.

With respect to circuit connectivity, combinational logic 830 is shown receiving signals from scan elements 810A-810D, and providing input values to scan cell 810M. Thus, scan cells 810A-810D are controlling cells for scan element 810M. Scan element 810G is also a controlling cell for scan element 810M since the output of scan cell 810G is provided as input to scan cell 810M. By observing combinatorial logic 850, it may be concluded that scan elements 810A, 810B, 810D-810H, 810Y and 810Z are also controlling elements for scan cell 810N.

According to step 720, designer selects 810M as the first scan element. According to step 730, tool/designer identifies the controlling scan elements 810A-810D and 810G based on the above description. According to step 740, the identified scan elements 810A-810D and 810G are divided into N group. For example, if N=2, 810A-810C may be assigned to first group and 810D and 810G may be assigned to second group.

With reference to step 750 the above procedure may be repeated for scan element 810N. Accordingly, corresponding controlling scan elements 810A-810B, 810D, 810G-810H and 810Y-810Z are divided into N groups. With reference to above example for N=2, 810A-810B, 810D and 810G may be assigned to first group and the remaining scan elements to second group. The procedure is repeated for other scan elements 810A-810H, 810Y and 810Z.

It may be appreciate that due to above grouping technique, each scan elements may be grouped into different groups. With reference to example, scan element 810D and 810G are assigned to second group in the first iteration (grouping with respect to scan element 810M), However, during the second iterations (grouping with respect to scan element 810N), scan elements 810D and 810G are assigned to first group. Such conflicts arising from with K scan elements may be resolved using K-coloring technique well known in the field of art as described above.

It should be appreciated that the features described above can be implemented in a combination of one or more of hardware, software and firmware. The description is continued with respect to an embodiment in which the features are operative by execution of software instructions as described below in further detail.

9. Digital Processing System

Figure 9:
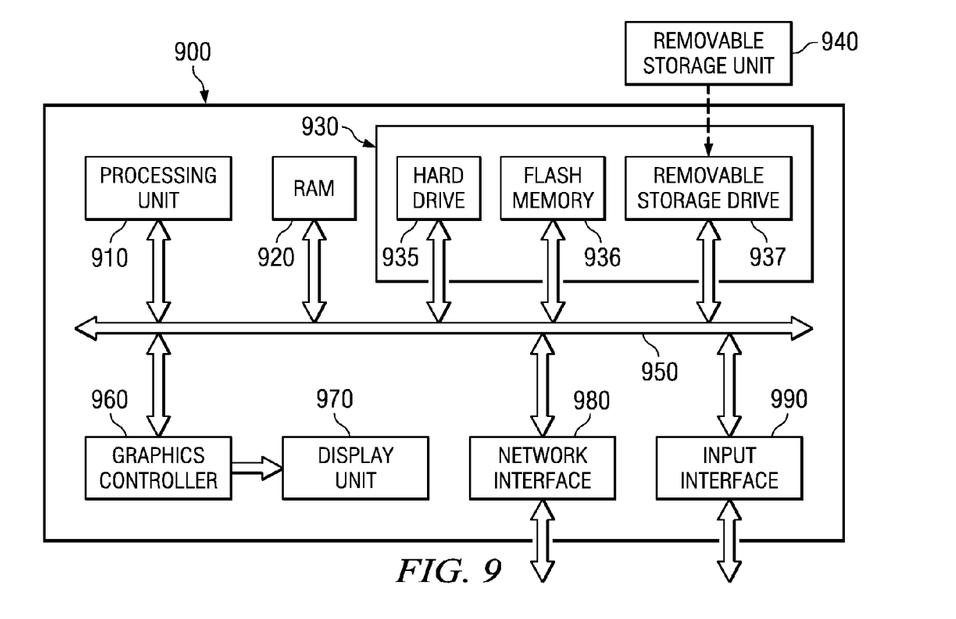
FIG. 9 is a block diagram of a digital system in which various features of the present invention are operative upon execution of appropriate software instructions.

FIG. 9 is a block diagram of digital processing system 900 illustrating an example system in which various aspects of the present invention can be implement. System 900 may correspond to tester (ATE) 160 or a design tool (computer aided design tool) using which integrated circuits are designed. Computer system 900 may contain one or more processors such as central processing unit (CPU) 910, random access memory (RAM) 920, secondary memory 930, graphics controller 960, display unit 970, network interface 980, and input interface 990. All the components except display unit 970 may communicate with each other over communication path 950, which may contain several buses as is well known in the relevant arts. The components of FIG. 9 are described below in further detail.

CPU 910 may execute instructions stored in RAM 920 to provide several features of the present invention. For example, the CAD tool may examine the digital representation (e.g., Netlists, well known in the relevant arts) to perform various steps of FIG. 5, provide for (e.g., by automatically suggesting/including the various connections, as would be desired) connecting the scan chains as described above. On the other hand, ATE 160 may generate the various signals to cause operation of some of the steps of FIG. 4, described above.

CPU 910 may contain multiple processing units, with each processing unit potentially being designed for a specific task. Alternatively, CPU 910 may contain only a single processing unit. RAM 920 may receive instructions from secondary memory 930 using communication path 950.

Graphics controller 960 generates display signals (e.g., in RGB format) to display unit 970 based on data/instructions received from CPU 910. Display unit 970 contains a display screen to display the images defined by the display signals. Input interface 990 may correspond to a key_board and/or mouse, and generally enables a user to provide inputs. Network interface 980 enables some of the inputs (and outputs) to be provided on a network. In general, display unit 970, input interface 990 and network interface 980 enable a user to design an integrated circuit.

Secondary memory 930 may contain hard drive 931, flash memory 936 and removable storage drive 937. Secondary storage 930 may store the software instructions (which perform the actions specified by various flow charts above) and data (e.g., netlists of the integrated circuits), which enable computer system 900 to provide several features in accordance with the present invention.

Some or all of the data and instructions may be provided on removable storage unit 940, and the data and instructions may be read and provided by removable storage drive 937 to CPU 910. Floppy drive, magnetic tape drive, CD_ROM drive, DVD Drive, Flash memory, removable memory chip (PCMCIA Card, EPROM) are examples of such removable storage drive 937.

Removable storage unit 940 may be implemented using medium and storage format compatible with removable storage drive 937 such that removable storage drive 937 can read the data and instructions. Thus, removable storage unit 940 includes a computer readable storage medium having stored therein computer software and/or data. An embodiment of the present invention is implemented using software running (that is, executing) in computer system 900.

In this document, the term "computer program product" is used to generally refer to removable storage unit 940 or hard disk installed in hard drive 935. These computer program products are means for providing software to computer system 900. As noted above, CPU 910 may retrieve the software instructions, and execute the instructions to provide various features of the present invention.

10. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of testing an integrated circuit using a sequential scan approach, said integrated circuit containing a plurality of scan enable terminals, each of said plurality of scan enable terminals being coupled to a corresponding one of a plurality of sets of scan elements, said plurality of sets of scan elements also being contained in said integrated circuit, each set of scan elements being in a functional mode when the corresponding scan enable terminal is at a first logic value and in a test mode when the corresponding scan enable terminal is at a second logic value, wherein the set of scan elements are connected as a scan chain in said test mode, said method comprising:

loading each of said scan chains with a corresponding scan vector by placing said plurality of scan enable terminals at said second logic value, wherein said loading is completed by a first time instance;

scanning out values in each of said scan chains starting from a second time instance; and providing logical values on said plurality of scan enable terminals such that a first scan enable terminal is at said first logic value for a first duration and a second scan enable terminal is at said first logic value for a second duration, wherein said first duration and said second scan duration are non-overlapping at least for some duration, wherein said first scan enable terminal and said second scan enable terminal are contained in said plurality of scan enable terminals, wherein said first duration and said second duration are between said first time instance and said second time instance;

applying a plurality of clock pulses to the scan elements between said first time instance and said second time instance, wherein the edges of said plurality of clock pulses are timed to equal the at speed operation of said integrated circuit, wherein said plurality of clock pulses contains only two clock pulses, wherein the first clock pulse launches a desired transition at a node and the second clock pulse captures the response for the desired transition, wherein the start and end of each of said first duration and said second duration are aligned with edges of said two clock pulses.

2. The method of claim 1, wherein said first duration starts aligned with a rising edge of said second clock pulse and said second duration starts aligned with a rising edge of said first clock pulse.

3. A computer readable medium carrying one or more sequences of instructions for causing a tester to test an integrated circuit using a sequential scan approach, said integrated circuit containing a plurality of scan enable terminals, each of said plurality of scan enable terminals being coupled to a corresponding one of a plurality of sets of scan elements, said plurality of sets of scan elements also being contained in said integrated circuit, each set of scan elements being in a functional mode when the corresponding scan enable terminal is at a first logic value and in a test mode when the corresponding scan enable terminal is at a second logic value, wherein the set of scan elements are connected as a scan chain in said test mode, wherein execution of said one or more sequences of instructions by one or more processors contained in said tester causes said one or more processors to perform the actions of:

loading each of said scan chains with a corresponding scan vector by placing said plurality of scan enable terminals at said second logic value, wherein said loading is completed by a first time instance;

scanning out values in each of said scan chains starting from a second time instance; and providing logical values on said plurality of scan enable terminals such that a first scan enable terminal is at said first logic value for a first duration and a second scan enable terminal is at said first logic value for a second duration, wherein said first duration and said second scan duration are non-overlapping at least for some duration, wherein said first scan enable terminal and said second scan enable terminal are contained in said plurality of scan enable terminals, wherein said first duration and said second duration are between said first time instance and said second time instance;

applying a plurality of clock pulses to the scan elements between said first time instance and said second time instance, wherein the edges of said plurality of clock pulses are timed to equal the at speed operation of said integrated circuit, wherein said plurality of clock pulses contains only two clock pulses, wherein the first clock pulse launches a desired transition at a node and the second clock pulse captures the response for the desired transition, wherein the start and end of each of said first duration and said second duration are aligned with edges of said two clock pulses.

4. The computer readable medium of claim 3, wherein said first duration starts aligned with a rising edge of said second clock pulse and said second duration starts aligned with a rising edge of said first clock pulse.

* * * * *